United States Patent [19]

Noda

[11] Patent Number: 4,795,941
[45] Date of Patent: Jan. 3, 1989

[54] ELECTROMAGNETIC WAVE SHIELDING, TRANSPARENT PANEL FOR A DISPLAY DEVICE

[75] Inventor: Kennichi Noda, Aichi, Japan

[73] Assignee: Riken EMC Co., Ltd., Japan

[21] Appl. No.: 876,938

[22] Filed: Jun. 20, 1986

Related U.S. Application Data

[63] Continuation-in-part of Ser. No. 641,971, Aug. 17, 1984, abandoned.

[30] Foreign Application Priority Data

Aug. 20, 1983 [JP]  Japan .................................. 152281
Jun. 29, 1984 [JP]  Japan .................................. 135789

[51] Int. Cl.⁴ ..................... H01J 9/14; H01J 29/89
[52] U.S. Cl. .......................... 313/479; 313/348; 313/112; 445/47; 445/60
[58] Field of Search ............ 313/478, 479, 348, 112; 358/250, 252, 253, 245; 445/46, 47, 49, 60, 65

[56] References Cited

U.S. PATENT DOCUMENTS 4,246,613  1/1981  Choder et al. ................. 358/253 X
4,633,322  12/1986  Fourny ........................... 358/253 X Primary Examiner—Leo H. Boudreau
Assistant Examiner—K. Wieder
Attorney, Agent, or Firm—Darby & Darby

[57] ABSTRACT

A transparent panel for a display device of cathode-ray tube type comprising, an electromagnetic shielding web defined by the wires made of an electromagnetic shielding material, and the transparent panel members sustaining said electromagnetic shielding web to shield the radiated electromagnetic waves so as to protect the observer from the effects of the waves.

2 Claims, 4 Drawing Sheets

FIG. 3
FIG. 4
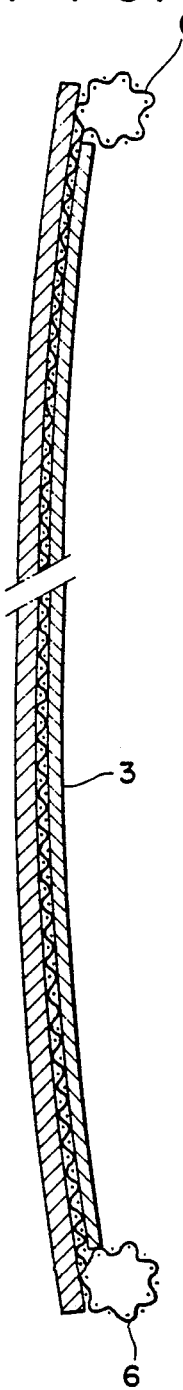
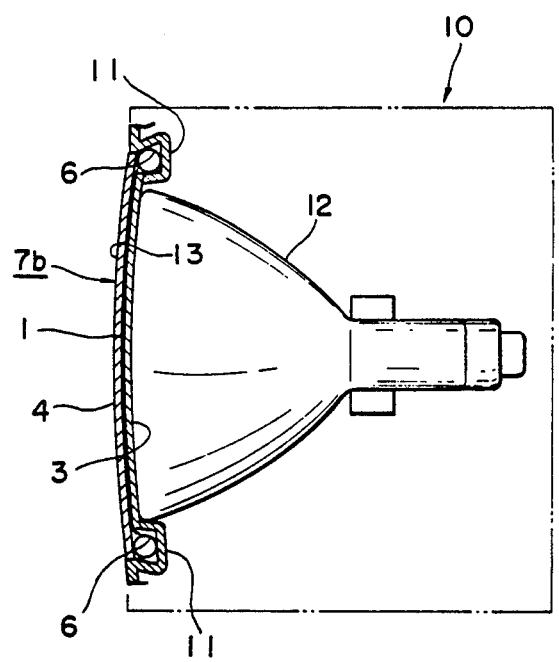

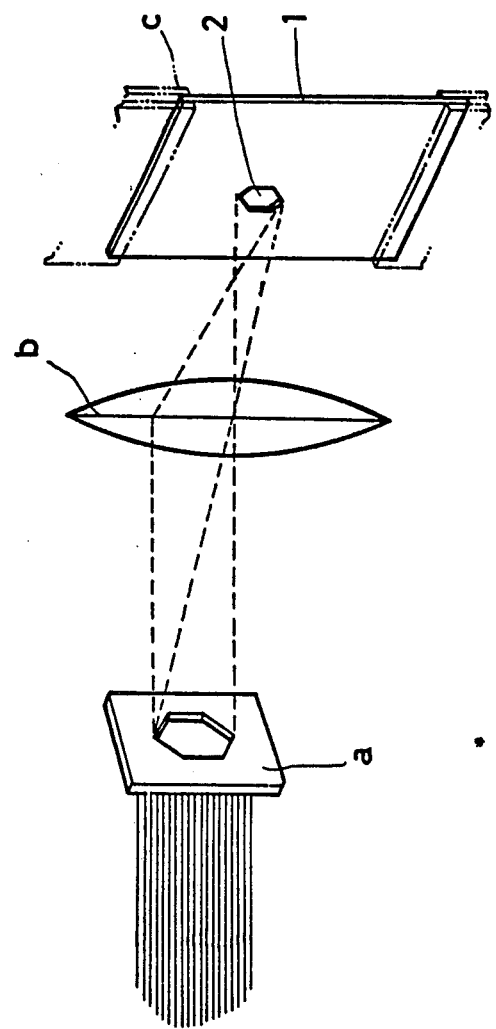

ELECTROMAGNETIC WAVE SHIELDING, TRANSPARENT PANEL FOR A DISPLAY DEVICE

BACKGROUND OF THE INVENTION

This is a continuation-in-part application of co-pending application, Ser. No. 06/641,971, filed on Aug. 17, 1984 abandoned.

This invention relates to a transparent panel mounted in front of a screen of a display device which is used for a computer, word processor, and so on.

A well known display device indicates information such as letters and figures on a screen of a cathode-ray tube. In the cathode-ray tube display device, a fluorescent screen is scanned by electron beams radiated from electron guns, so that the bright points defining visual letters corresponding to signals are designated. At the same time, the electromagnetic waves including ultra-low-frequency waves and microwaves as by-products are generated and radiated towards operators.

Nowadays, well-informed persons in this field are warning against these electromagnetic waves, saying these waves are harmful for human body, because they cause the eye-fatigue and stresses upon operators as they stimulate the nerve center.

However the effects of the electromagnetic waves upon human body are not elucidated clearly now, it becomes an important theme in view of environmental sanitation for working in recent years.

SUMMARY OF THE INVENTION

It is therefore an object of this invention to provide a transparent panel for a screen of a cathode-ray tube, wherein the transparent panel is disposed in front of the screen so that the observers can be protected from the effects of electromagnetic waves by its shielding ability.

A further object of the present invention is to provide a transparent panel comprised of, an electromagnetic shielding web defined by intersected wires made of an electromagnetic shielding material and transparent panel members sustaining the electromagnetic shielding web.

Thus, the electromagnetic waves radiated from the screen of the display device are effectively shielded by the electromagnetic shielding web. Further, images of the letters and the figures which are drawn on the screen, are observed without interruption through the apertures of the shielding web and the transparent panel members which sustain the shielding web, so that the observers can enjoy a clear screen without the adverse affects of electromagnetic waves.

The above and further objects and novel features of this invention will more fully appear from the following description when the same is read in connection with the accompanying drawings. It is to be expressly understood, however, that the drawings are for purpose of illustration only and are not intended as a definition of the limits of the invention.

BRIEF DESCRIPTION OF THE DRAWINGS

In the accompanying drawings, the preferred embodiments of this invention are illustrated.

FIG. 2 shows a longitudinally sectioned side elevational view of the transparent panel 7a.

FIG. 3 shows a longitudinally sectioned side elevational view of the transparent panel 7b.

FIG. 4 shows a longitudinally sectioned side elevational view of a schematic illustration, in which the transparent panel 7b is mounted to the display device 10.

FIG. 6 shows a preferred embodiment of a laser beam boring apparatus constructed in accordance with the present invention.

DETAILED DESCRIPTION OF THE PREFERRED EMBODIMENTS

The following examples are illustrative of the preferred embodiments of this invention.

EXAMPLE 1

An electromagnetic shielding web can be comprised of the wires having metal cores made of an electromagnetic shielding material such as copper, iron and stainless steel, and a copper oxide coating plated on the surface of the metal cores.

Figure 1:
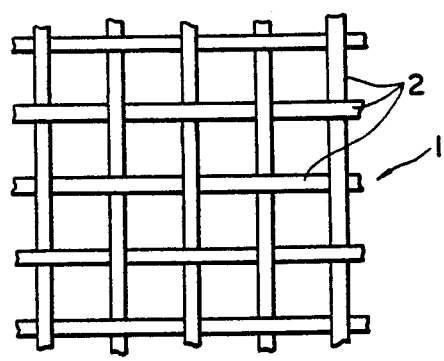
FIG. 1 shows an enlarged plan view of the shielding web 1.

Referring now to FIG. 1, there is shown a plan view of the shielding web 1 comprising fine wire shaped metal cores 2 made of an electromagnetic shielding material such as copper, iron and stainless steel, wherein coated metal wires are netted crosswise each other to form the shielding web and plated by copper oxide coating.

The metal core, of which the outer diameter is amount 50 microns is netted crosswise, equally spaced apart 250 microns so as to form the shielding web 1 of which the aperture ratio is 50 to 80 percentage. Thus the transparency of said shielding web 1 becomes exceedingly satisfactory.

Further, the copper oxide coating provides the electromagnetic shielding web with gray or black coloring, so that the scattering of lights by the fine wire shaped metal core is effectively inhibited. Furthermore, the copper oxide coating increases the electromagnetic shieldability, because of its own shieldability. The color variations of the copper oxide may be adjusted and selected, corresponding to the degree of oxidation by oxidizers.

When stainless steel is used for the fine wire shaped metal core 2, it cannot be plated directly by copper oxide or silver because the surface constitution of the stainless steel is too dense to be plated by them. It is possible to plate the stainless steel with copper oxide or silver if the stainless steel wire is treated by nickel plating in advance. Therefore, the metal core of the stainless steel must be steeped in nickel bath including hydrochloric acid beforehand. The hydrochloric acid erodes the surface of the stainless steel, so that it can be nickel plated. Then, the copper oxide plating follows.

. In the above-mentioned arrangement, the nickel coating increases the electromagnetic shieldability of the fine wire shaped metal core 2 and the copper oxide coating because of its own shieldability.

In the composition of the shielding web 1, without netting the fine wire shaped metal core 2, it may be comprised of, a metal base of the electromagnetic shielding material such as copper, iron and stainless steel, and coatings of nickel and copper oxide of about 20 microns thickness plated to both sides of the metal base, wherein the metal base can be bored by a laser beam to form apertures. In this case, the boring of the metal base may precede the plating.

EXAMPLE 2

The shielding web may be comprised of the wires having, a metal core made of the electromagnetic shielding material such as copper, iron and stainless steel, and coatings of silver and copper oxide plated orderly to the metal core, wherein the wires are netted to form the shielding web.

This Example 2 adds the silver coating to the metal core of the composition of the Example 1.

In this case, it is also necessary to nickel plate the wires before silver plating when stainless steel is used for the metal core.

Silver has an excellent electromagnetic shieldability, because of its high magnetic permeability and high electric conductivity. Further, each of the metal core and coatings of nickel, silver and copper oxide has electromagnetic shieldabilities which are different in the efficient frequency ranges. Therefore, the total shieldability is promoted by their shielding effects. The excellent shieldability of the shielding web of this Example 2 is appreciated in the after-mentioned test.

The electromagnetic shielding web comprising the metal core and the silver coating only may provide excellent electromagnetic shieldability, too.

In this embodiment, the aforementioned laser beam boring of the metal base also may be useful for forming the shielding web.

EXAMPLE 3

Figure 2:
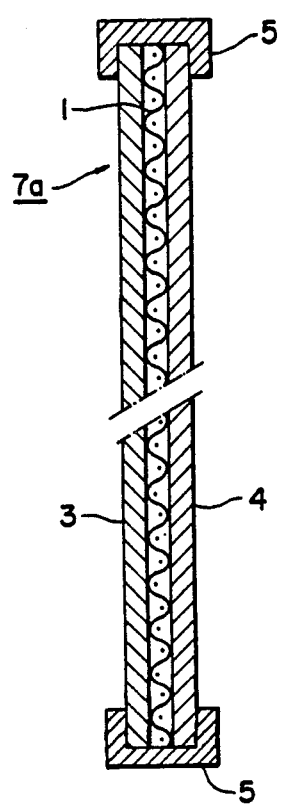

The transparent panel 7a is comprised of, the shielding web 1, the transparent resin panels 3, 4 made of transparent resin such as acrylic resin consisting the transparent panel members, wherein the transparent panels are put together to both side surfaces of the shielding web 1 to define a rectangular configuration as shown in FIG. 2, and a retaining frame 5 having a U-like configuration in cross section made of, for example, monoacrylic resin and vinyl chloride resin, wherein the retaining frame is fitted to cover the external surroundings of the transparent resin panels.

The transparent resin panels 3, 4 may be colored properly to green, gray, pink, red and other colors as long as the transparency is not adversely affected. The thickness of the transparent resin panels is 2-5 mm. The shielding web 1 is effectively protected from oxidation and erosion, and becomes easy to be handled with, because it is covered with the transparent resin panels 3, 4 on the surface of each of its sides.

Further, the transparent resin panels 3, 4 may be matted in the front surface thereof, so that the reflection of lights on the panels is inhibited.

The transparent panel 7a of the composition can be mounted to a conventional display device 10, by utilizing double sided adhesive tape, a preferable engaging hook etc., to set the retaining frame 5 for the external surrounding frame of the screen. Further, it can be mounted to the display device by suction devices which are equipped for the external surroundings of the transparent panel 7a.

FIG. 3 shows the transparent panel 7b which can be mounted in contact with the screen 13 of the cathode-ray tube 12. The transparent panel 7b is comprised of, the shielding web 1 and the transparent resin panels 3 and 4, made of, for example, acrylic resin, joined at both sides of the shielding web 1, and curved along the surface of the screen 13, so as to define a smoothly curved and forwardly embossed surface.

In defining the transparent panel 7b, the periphery of the shielding web 1 projects and extends from the transparent resin panel 3, which is positioned on the back side of the shielding web, wherein the periphery of the shielding web surrounds the transparent resin panel, wherein there is provided mounting loop 6.

As shown in FIG. 4, the mounting loop 6 is fitted to the display device 12 with fitting portion 11 which is defined in the internal periphery of the screen portion of said display device 10, so as to mount the transparent panel 7b to the display device 10, wherein the transparent panel 7b is mounted to and in contact with the screen 13 of the cathode-ray tube 12.

As another method for mounting the transparent panel 7b, a cylindrical elastic material such as silicone rubber may be disposed around the external periphery of the transparent panel 7b to roll up the projected periphery of the shielding web 1.

Further, a packing member comprised of the elastic material and the electric conductive web member may be provided around the external periphery of the elastic material, so as to mount the transparent panel 7b to the display device 10 by connecting the projected periphery of the shielding web 1 with the packing member.

The transparent panel 7a or 7b can be fixedly mounted in the manufacturing process, or, alternatively, can be detachably mounted after the process.

Thus, the transparent panel 7a or 7b is adapted to be mounted in various ways to the display device.

Also, there are many ways to form the transparent panel member by joining the transparent resin panel 3 and 4 onto both sides of the shielding web 1. For example, the transparent resin panels 3 and 4 may be hot-pressed to the shielding web 1, or they may be adhered to each other by an adhesive agent.

Further, the transparent panel member may be comprised of a transparent resin member integrally coating the electromagnetic shielding web. In this case, monomer may be disposed on both sides of the shielding web 1 to polymerize thereon, and a mold may be disposed on both sides of the shielding web leaving spaces so as to pour the transparent resin material into the spaces.

However the above-mentioned methods are practicable, it is easy to adhere them in order not to generate bubbles therein, and to define a smooth surface.

However the transparent panel 7a or 7b is mounted in front of the screen by the methods previously, if the transit directions of the shielding web 1 were parallel to the longitudinal direction and the transversal direction of the transparent panel, the transversal transit direction of the shielding web 1 becomes corresponding to that of the scanning line of the screen. Thus, the clearness of the picture of the display is somewhat deteriorated by the interference between the shielding web and the scanning line. Therefore, it is preferable to incline the transit direction of said shielding web 1 by 45 degrees generally to the external surrounding frame, so as not to be coincident with the direction of the scanning line.

The radiation of the electromagnetic waves from the display device 10 can be more efficiently prohibited together with the shielding effects of after-mentioned transparent panel 7, by covering the external surroundings of the display device 10 by means of metal coating having an electromagnetic shieldability such as copper foil so as to connect the fitting portion 11 with the coating electrically.

TEST FOR THE SHIELD EFFECT

1. Transparent Panel Used for the Test

We have tested the shield effect of the folloiing transparent panel of this invention, in view of the frequency range of the electromagnetic waves.

The transparent panel 7 used for this test is manufactured in the steps of: netting the fine wire shaped metal core 2 of stainless steel of which the external diameter is 50 microns crosswise at intervals of 254 microns; plating nickel and silver orderly thereon; defining black colored copper oxide coating thereon; and joining the transparent panels 3 and 4 of acrylic resin onto both sides of the shielding web 1.

2. Method of the Test

Figure 5:
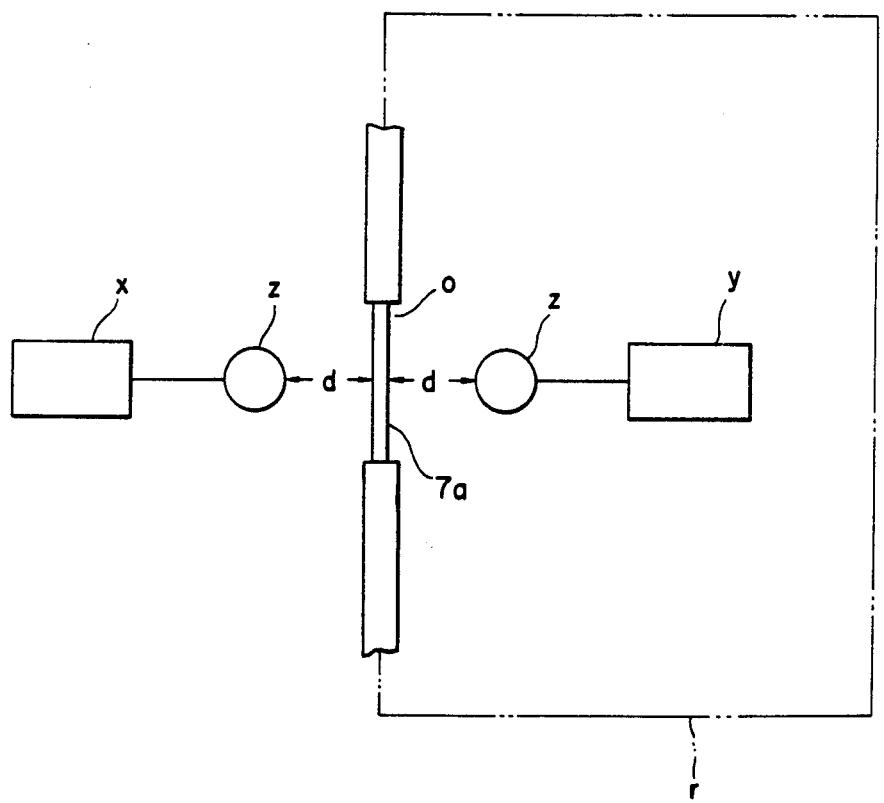
FIG. 5 shows a longitudinally sectioned side elevational view which illustrates schematically the method of the test for the shielding effect of this invention.

As shown in FIG. 5, this test is prepared in the following steps: fitting the transparent panel 7a into the aperture O of the electromagnetic shielding room R, disposing the transmitter X out of the electromagnetic room R and the receiver Y in the room R, opposing the transmitter X and the receiver Y through the transparent panel 7 intermediately, and setting the distance D which extends between each antenna Z and the opposite side of the transparent panel 7 to 12 inches.

In the case of measuring the electromagnetic waves of which frequency range is under 20 MHz, loop antennas are used for the antennas Z. In the case of the waves over 100 MHz, dipole antennas are used for antennas Z.

3. Result of the Test

This test ended in the following result.

| Frequency of Electromagnetic Wave | Shield Effect |
| --- | --- |
| 150 KHz | 35dB |
| 500 KHz | 47dB |
| 10 KHz | 78dB |
| 20 MHz | 90dB |
| 100 MHz | 107dB |
| 400 MHz | 70dB |
| 1 GHz | 49dB |

FIG. 6 shows a preferred form of apparatus for forming the apertures in the panel by laser boring. The laser beam emitted with a designated pulse frequency is condensed by a condenser lens B after passing through a mask A with a pattern hole similar to the form of the aperture 2 to be bored, then its spot beam is applied on the electromagnetic shielding metal film mounted on its holder C.

The size of the image of the spot beam focused on the said metal film 1 is easily changed by varying the distance between the said condenser lens B and the said metal film 1. One to dozens of pulses of the spot beam are applied at the same point on the said metal film 1, thus forming an aperture 2 there. After boring one such aperture 2, the holder C is transferred to the next position wherein the spot beam is applied at the next point on the metal film 1, thus performing the next boring operation. The transfer of the said holder C can be conducted with accurate position control by relating the transfer with the number of pulses of the said laser beam.

As described in detail, according to the method of this invention, it is possible to protect the observers from the effects of the electromagnetic waves, and it is also possible to decrease the eye-fatigue remarkably, by shielding effectively the waves which are radiated from the cathode-ray tube by means of the electromagnetic shielding web without deteriorating the clearness of the picture of the screen, because the transparent panel 7 which is used for the display device is comprised of, the electromagnetic shielding web which is made up by netting the fine wire of electromagnetic shieldable material crosswise, and the transparent panel members which sustain the shielding web in a panel configuration.

Further, eye-fatigue is more effectively protected by using the electromagnetic shielding webs 1 of Examples 1 and 2 which are colored by the copper oxide coating to inhibit the reflection of lights. Furthermore, in Example 2, the silver coating can increase the electromagnetic shielding effect, because of its own shieldability.

Having now fully described the invention, it will be apparent to one of ordinary skill in the art that many changes and modifications can be made thereto without departing from the spirit or scope of the invention as set forth herein.

What is claimed is:

1. A method of forming an electromagnetic shielding web for a display device, the web including a metal base plate of electromagnetic shielding material, the method including the step of laser boring a multiplicity of apertures in the metal base plate by an apparatus, the apparatus comprising a laser, the laser emitting a pulsed laser beam of a designated pulse frequency;

a condenser lens, the lens being disposed in the path of the laser beam to allow the beam to pass therethrough, the lens acting to condense the laser beam; and a mask interposed between the laser and the condenser lens and in the path of the laser beam, the mask having a pattern hole formed through the thickness thereof, the hole having a shape which is similar to the shape of each aperture formed in the base plate, wherein the base plate is positioned relative to the condenser lens so that the laser beam from the condenser lens strikes the base plate to form an aperture therein.

2. A method of forming an electromagnetic shielding web for a display device according to claim 1, wherein coatings of nickel and copper oxide are plated on both sides of said metal base plate.

* * * * *